United States Patent
Komiyama et al.

(10) Patent No.: US 8,395,142 B2
(45) Date of Patent: Mar. 12, 2013

(54) INFRARED LIGHT DETECTOR

(75) Inventors: Susumu Komiyama, Tokyo (JP); Patrick Nickels, Tokyo (JP)

(73) Assignee: Japan Science and Technology Agency, Kawaguchi-Shi (JP)

( * ) Notice: Subject to any disclaimer, the term of this patent is extended or adjusted under 35 U.S.C. 154(b) by 0 days.

(21) Appl. No.: 13/322,208

(22) PCT Filed: Apr. 16, 2010

(86) PCT No.: PCT/JP2010/056864
§ 371 (c)(1),
(2), (4) Date: Nov. 23, 2011

(87) PCT Pub. No.: WO2010/137422
PCT Pub. Date: Dec. 2, 2010

(65) Prior Publication Data
US 2012/0068158 A1    Mar. 22, 2012

(30) Foreign Application Priority Data
May 25, 2009   (JP) .................................. 2009-125194

(51) Int. Cl.
*H01L 29/06*   (2006.01)
*G01J 5/00*   (2006.01)
(52) U.S. Cl. ................. 257/24; 257/E31.001; 250/338.1
(58) Field of Classification Search .................... 257/14, 257/21, 24, 29, 187, 192, 194, 195, 196, 257/428, E31.001, E31.054, E31.093, E31.128; 250/338.1, 338.4, 339.14
See application file for complete search history.

(56) References Cited

U.S. PATENT DOCUMENTS

| 4,106,044 A | 8/1978 | Yoshida et al. |
| 5,309,007 A | 5/1994 | Kelner et al. |
| 2007/0215860 A1* | 9/2007 | Komiyama et al. ............. 257/21 |

FOREIGN PATENT DOCUMENTS

| JP | 11-150261 | 6/1999 |
| JP | 2000-150862 | 5/2000 |
| JP | 2008-205106 | 9/2008 |
| WO | 2006/006469 | 1/2006 |
| WO | 2008/102630 | 8/2008 |

OTHER PUBLICATIONS

Reset Operation of Quantum-Well Infrared Phototransistors, Zhenghua An et al., IEEE Transacttions on Electron Devices, vol. 54, No. 7, Jul. 2007, pp. 1776-1780.

(Continued)

*Primary Examiner* — Victor A Mandala
*Assistant Examiner* — Selim Ahmed
(74) *Attorney, Agent, or Firm* — Rankin, Hill & Clark LLP

(57) ABSTRACT

Provided is an infrared light detector 100 with a plurality of first electronic regions 10 which are electrically independent from each other and arranged in a specific direction, formed by dividing a single first electronic region. An outer electron system which is electrically connected to each of the plurality of first electronic regions 10 in a connected status is configured such that an electron energy level of excited sub-bands of each of the plurality of first electron regions 10 in a disconnected status is sufficiently higher than a Fermi level of each of second electronic regions 20 opposed to each of the first electronic regions 10 in a conduction channel 120.

3 Claims, 10 Drawing Sheets

OTHER PUBLICATIONS

A sensitive double quantum well infrared phototransistor, Zhenghua An et al., Journal of Applied Physics 100, 044509 (2006).
Infrared phototransistor using capacitively coupled two-dimensional electron gas layers, Applied Physics Letters 86, 172106 (2005).

Nickels, et al., "Metal Hole Arrays as Resonant Photo-Coupler for Charge Sensitive Infrared Phototransistors", IEEE Journal of Quantum Electronics, vol. 46, No. 3, Mar. 2010, eight pages.

* cited by examiner

FIG.3 (a)
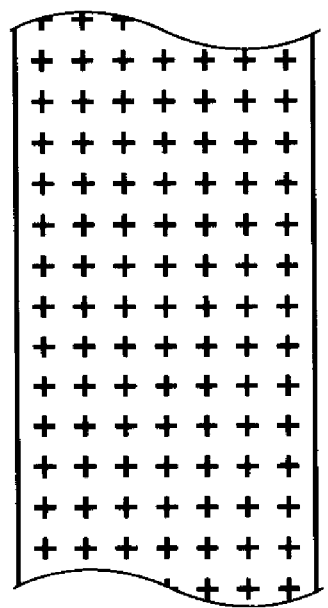
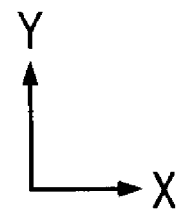
FIG.3 (b)
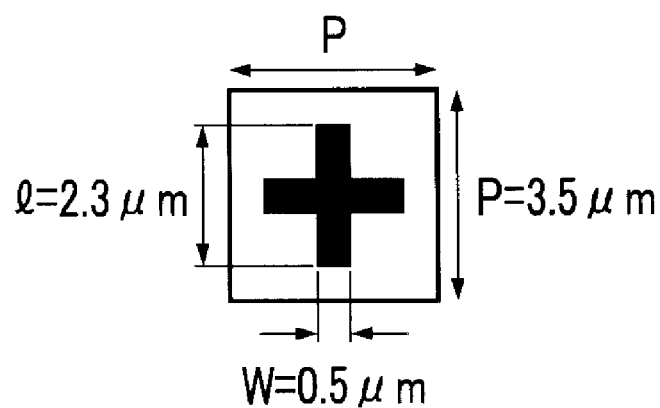
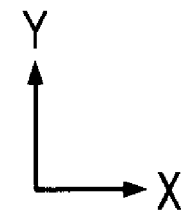

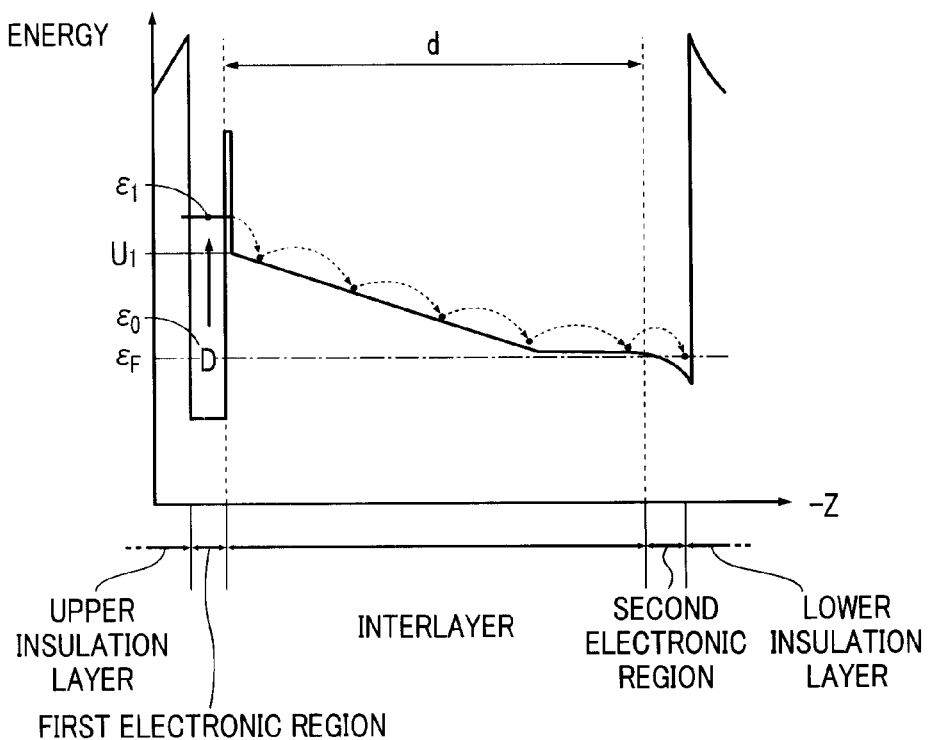
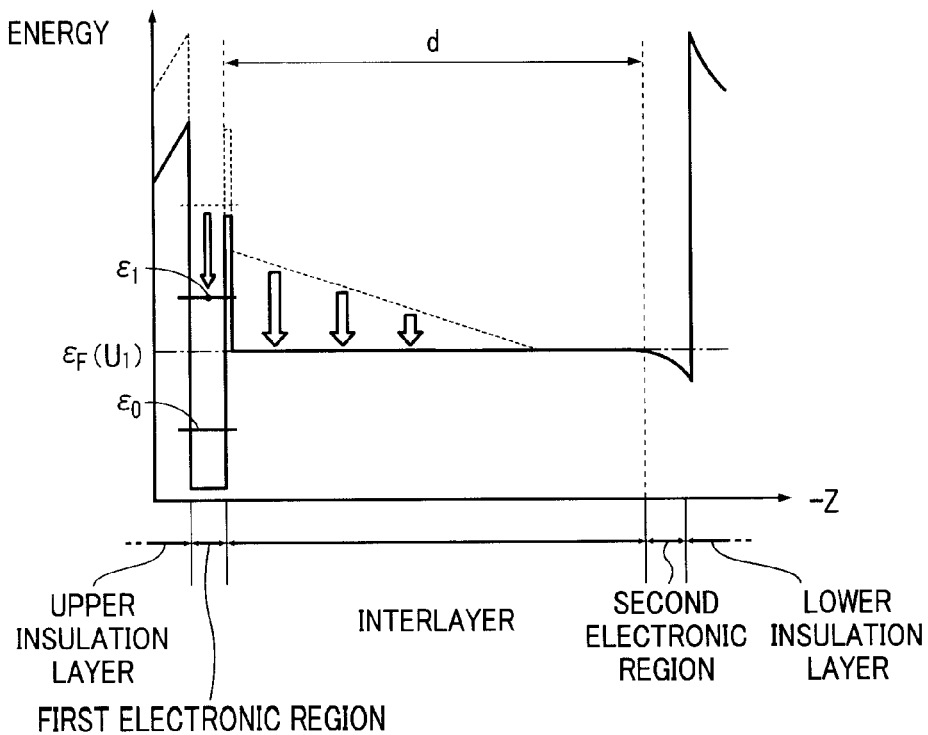

INFRARED LIGHT DETECTOR

FIELD OF THE INVENTION

The present invention relates to an infrared light detector.

DESCRIPTION OF THE RELATED ART

There has been proposed a high sensitivity infrared light detector having a CSIP (Charge Sensitive Infrared Phototransistor) as an element by the inventors of the present application (for example, refer to published PCT international application WO2006/006469A1 (Patent Document 1), "Infrared phototransistor using capacitively coupled two-dimensional electron gas layers (An et al.)" Appl. Phys. Lett. 86, 172106 (2005), "A sensitive double quantum well infrared photoresistor (An et al.)" J. Appl. Phys., 100, 044509 (2006) (Non-Patent Literature 1)).

According to this infrared light detector, infrared light is concentrated on a two-dimensional electronic layer (floating gate), such as a quantum well or the like which is electrically isolated from the ambient by a microstrip antenna or a metal patch array or the like. This generates a perpendicular oscillating electric field in the isolated two-dimensional electronic layer. Then, an electron in the isolated two-dimensional electronic layer is excited by the oscillating electric field and transitioned from a ground sub-band to an excited sub-band, and then escapes from the isolated two-dimensional electronic layer to a conduction channel or the like in a charge sensitive transistor disposed right below the isolated two-dimensional electronic layer. Thereby, the isolated two-dimensional electronic layer becomes positively charged. As a result, an electric conductivity between the source-drain of the CSIP increases.

More specifically, when the infrared light is introduced into the infrared light detector, an oscillating electric field is formed in a direction perpendicular to a first electronic region (Z direction) by a light coupling mechanism. By this oscillating electric field, electrons are transitioned from the ground sub-band (electron energy level $\epsilon_0$) to the excited sub-band of the quantum well in the first electronic region as indicated by an upward arrow in FIG. 4($a$). The electrons transitioned to the excited sub-band escape from a potential barrier of the quantum well in the tunneling process as indicated by a dashed arrow in FIG. 4($a$). In order to enable the tunneling escape process, a potential $U_1$ of the interlayer on the quantum well side is set lower than an electron energy level $\epsilon_1$ of the excited sub-band and higher than a Fermi energy $\epsilon_F$ (electrochemical potential) in an opposed region of the conduction channel in order to acquire energy gradient of the interlayer. Therefore, the electrons which escape from the excited sub-band in the tunneling process flow into the conduction channel according to the energy gradient of the interlayer, especially into the region opposed to the first electronic region (which corresponds to "a second electronic region" of the present invention). Accordingly, the first electronic region is positively charged or ionized. That is, the first electronic region and the second electronic region function as a capacitor sandwiching the interlayer in a disconnected status, thereby storing positive electric charge in the first electronic region.

Then, as a result of continuously introducing the infrared light into the infrared light detector, since the number of electrons escaping from the first electronic region to the conduction channel continuously increases as described above, the amount of the electric charge in the first electronic region continuously increases correspondingly. Moreover, as the amount of electric charge in the first electronic region increases, the electric conductivity of the conduction channel increases. Therefore, by detecting the change of electric conductivity of the conduction channel, it is able to detect an integral value of the incident infrared light with high sensitivity.

Accordingly, since the change of the electric conductivity between the source-drain of the CSIP is saturated in a relatively short time from starting to detect the infrared light, the infrared light sensitivity will have limitations.

More specifically, by the increase of the amount of positive electric charge $\Delta Q$ in the first electronic region, the electron energy level $\epsilon_1$ of the excited sub-band in the first electronic region decreases, and the difference from the Fermi level $\epsilon_F$ (electrochemical potential) of the second electronic region in the conduction channel where the electrons mainly escape to, becomes smaller. For example, when the amount of positive electric charge $\Delta Q$ in the first electronic region reaches $\Delta Q_{sat} = (\epsilon_1 - U_1)C/e$, a state in which the energy high-low difference in the interlayer is large as shown in FIG. 4($a$), becomes a state in which the energy high-low difference in the interlayer disappears as shown in FIG. 4($b$). Here, $C = \epsilon/d$ represents an electrical capacitance per unit area formed by the first electronic region and the second electronic region in the conduction channel, d denotes a distance between a first electronic layer and a second electronic layer, and $\epsilon$ denotes an electric permittivity of the intermediate region. Then, not only the excited electrons escape from the first electronic region to the conduction channel, but also the electrons which are thermally excited in the conduction channel are able to backflow to the first electronic region, and therefore net escape does not occur. As a result, the increase of the amount of the electric charge in the first electronic region stops and saturates. Then, even though the infrared light is further introduced, the electric conductivity of the conduction channel will not change any more, and infrared light detection based on the change rate of the electric conductivity can not be continued.

In this regard, the inventors of the present application have proposed an infrared light detector with higher sensitivity which was modified to solve the above problem (Refer to Japanese patent laid-open publication number 2008-205106 (Patent Document 2) and "Reset Operation of Quantum-Well Infrared Phototransistor (Zhenghua An, Takeji Ueda, Kazuhiko Hirakawa and Susumu Komiyama), IEEE Transactions on Electron Devices, Vol. 54, 1776-1780 (2007) (Non-Patent Literature 2)).

According to this infrared light detector, the isolated two-dimensional electronic region is electrically connected to the conduction channel of the source, drain, or between the source-drain via a reset gate, before the change of the electric conductivity between the source-drain saturates. Accordingly, electrons flow into the first electronic region from an outer electron system and these electrons are coupled to positive electric charge, thereby resetting the amount of electric charge of the first electronic region to 0 promptly and a value of the electric conductivity is returned to an initial value before the change, and the energy diagram returns to the state shown in FIG. 4($a$) from the state shown in FIG. 4($b$). That is, the energy level $\epsilon_1$ of the excited sub-band in the first electronic region 10 returns to a state high enough such that the electrons transitioned to the excited sub-band may flow out from the first electronic region 10 to the second electronic layer 104 easily or at a high probability.

Thereafter, the first electronic region is switched from a connected status to a disconnected status, and therefore returns to a state in which the electric charge of the first electronic region 10 proceeds by the escape of the electrons excited in the excited sub-band from the isolated two-dimensional electronic region as described above. Therefore, it is able to detect infrared light repeatedly and cumulatively, thereby enabling the improvement of the infrared light sensitivity.

SUMMARY OF THE INVENTION

Problems to be Solved by the Invention

However, if the voltage $V_{DS}$ applied between the source-drain in order to observe the change of electric conductivity as described above between the source-drain, becomes a voltage equal to or more than approximately 0.22 hv/e (e denotes an elementary electric charge, h denotes a Planck's constant, and v denotes an oscillation frequency of the excitation light according to the width of the quantum well), the detection sensitivity of the infrared light rather descends.

It is therefore an object of the present invention to solve the above mentioned problem and to provide an infrared light detector capable of further improving the infrared light sensitivity.

Means to Solve the Problem

The present invention is related to an infrared light detector having a first electronic region configured to be capable of being maintained in an electrically isolated status in a first electronic layer which is a two-dimensional electronic layer; a light coupling mechanism configured to excite an electron by generating an oscillating electric field component perpendicular to the first electronic region according to an incident infrared light, and allowing the electron to transit between sub-bands in a quantum well formed in the first electronic region; a conduction channel in a second electronic layer which is a two-dimensional electronic layer disposed parallel to the first electronic layer via an intermediate insulation layer, whose electric conductivity varies as a result of the electron excited by the light coupling mechanism flowing out of the first electronic region; a status controlling mechanism configured to perform switching between a disconnected status in which the first electronic region is electrically disconnected from an outer electron system and a connected status in which the first electronic region is electrically connected to the outer electron system; and which detects the incident infrared light by detecting a variation of the electric conductivity with respect to a specific direction of the conduction channel.

The inventors of the present application discovered that the detection sensitivity of the infrared light is limited as described above due to the reasons to be described hereinafter. That is, in actual measurement, a Fermi energy (electrochemical potential) of the drain side increases by $eV_{sd}$ since a limitary source-drain voltage $V_{SD}$ is applied. As a result, when the first electronic region is formed from a single region, as shown in FIG. 7, the saturation of the amount of electric charge (refer to FIG. 3(b)) occurs at a value $\Delta Q_{sat} = (U_1-\epsilon_0-eV_{SD})C/e$ which is smaller than $\Delta Q_{sat}=(U_1-\epsilon_0)C/$. Therefore, the applicable source-drain voltage $V_{SD}$ is limited by $eV_{SD} \ll U_1-\epsilon_0 < hv$, and the actual upper limit becomes approximately 0.22* hv/e.

In view of the above finding, the infrared light detector of the present invention for solving the above problem is characterized in that the first electronic region which is a single first electronic region, is divided into a plurality of first electronic regions which are electrically independent from each other and are arranged in the specific direction opposed to the conduction channel, wherein the outer electron system is configured to satisfy a predetermined condition for each of the plurality of first electronic regions, and wherein the predetermined condition is a condition that an electron energy level of the excited sub-bands of each of the plurality of first electronic regions in the connected status becomes higher with respect to the Fermi level of each of the second electronic regions opposed to each of the plurality of first electronic regions in the conduction channel to a degree which enables the electron transitioned to the excited sub-bands of each of the plurality of first electronic regions in the disconnected status to flow out to each of the second electronic regions.

According to the infrared light detector of the present invention, each of the plurality of first electronic regions formed by dividing the single first electronic region is switched from the disconnected status to the connected status. By this, the Fermi level (electrochemical potential) of each of the first electronic regions becomes equal to the Fermi level (electrochemical potential) of each of the outer electron system.

Here, the outer electron system is configured to satisfy the predetermined condition as for each of the first electronic regions. Therefore, sufficient high-low difference is secured between the electron energy level of the excited sub-bands of each of the first electronic regions in a disconnected status and the Fermi level (electrochemical potential) of each of the second electronic regions opposed to each of the first electronic regions in the conduction channel. "Sufficient high-low difference" means a high-low difference of a degree which enables the electrons transitioned to the excited sub-bands to escape easily and with a high possibility from each of the first electronic regions in the disconnected status to each of the second electronic regions in the conduction channel. Therefore, it is able to easily allow the electrons to escape from each of the first electronic regions to each of the second electronic regions in the conduction channel, while enlarging the potential difference of the conduction channel in the specific direction.

In this regard, according to the infrared light detector of the present invention, it is able to remarkably improve the detection accuracy of the infrared light (for example, approximately to a degree multiplied by the number of the first electronic regions) compared to a case where the infrared light is detected by a single first electronic region before being divided in which the Fermi level (electrochemical potential) can be only adjusted to become equal to the Fermi level (electrochemical potential) of a single outer electron system.

Each of the second electronic regions may be configured as the outer electron system of each of the first electronic regions.

It is cable to form a plurality of gate electrodes so as to traverse the single first electronic region on an upper surface of an upper insulation layer which sandwiches the first electronic layer which is a two-dimensional electronic layer together with the intermediate insulation layer, wherein the single first electronic region is divided into the plurality of first electronic regions by applying bias voltage to each of the gate electrodes to form a potential barrier in the first electronic layer which is a two-dimensional electronic layer.

BRIEF DESCRIPTION OF THE DRAWINGS

FIG. 3 is a structural explanatory diagram illustrating a light coupling mechanism of the infrared light detector of the present invention;

FIG. 4 is a regional energy diagram of the infrared light detector;

DETAILED DESCRIPTION OF THE PREFERRED EMBODIMENTS

An embodiment of an infrared light detector according to the present invention will be described with reference to the drawings.

Figure 1:
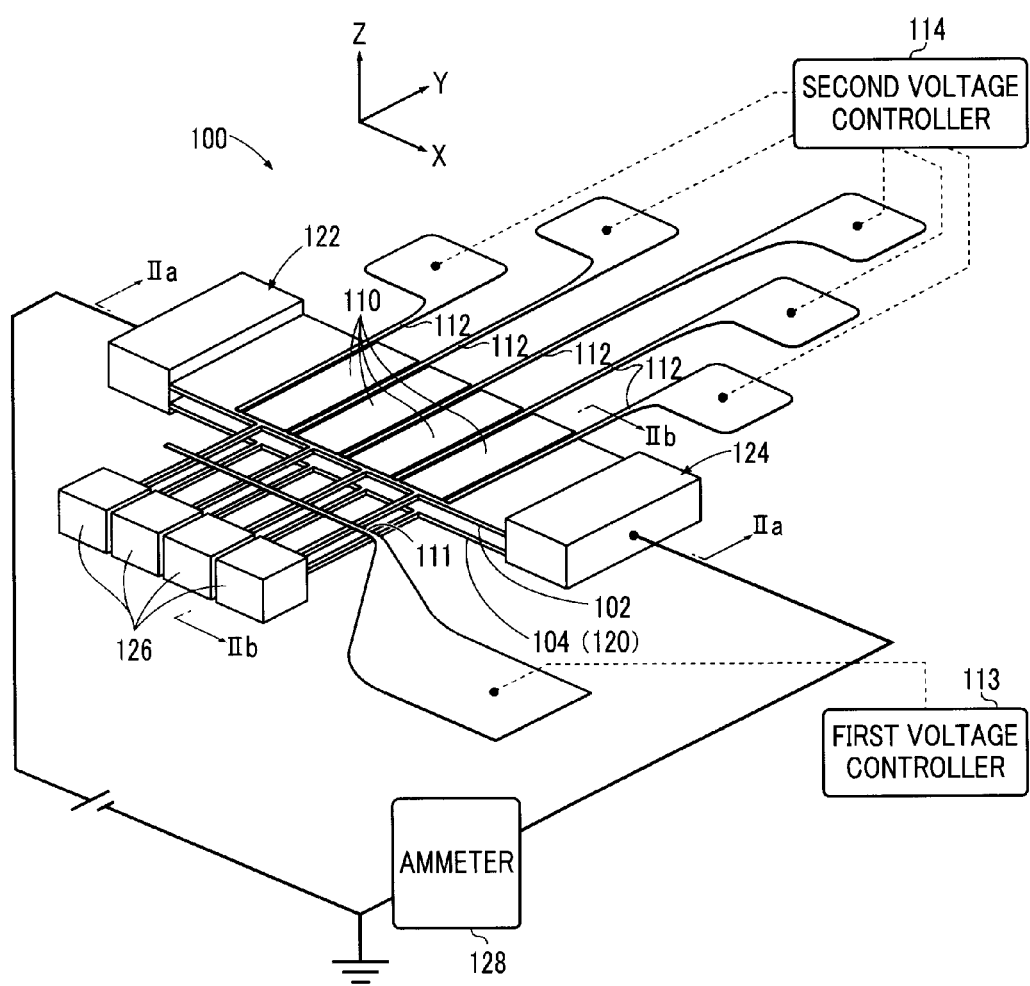
FIG. 1 is a structural explanatory diagram illustrating a main part of an infrared light detector according to the present invention.

A structure of the infrared light detector will be described first. The infrared light detector 100 illustrated in FIG. 1 is provided with a first electronic layer 102, a second electronic layer 104, a light coupling mechanism (an exciting mechanism) 110, a first gate electrode 111, a second gate electrode 112, a first voltage controller (or a pulse generator) 113, and a second voltage controller 114. For descriptive convenience, X, Y and Z axes are defined as illustrated in FIG. 1.

Figure 2:
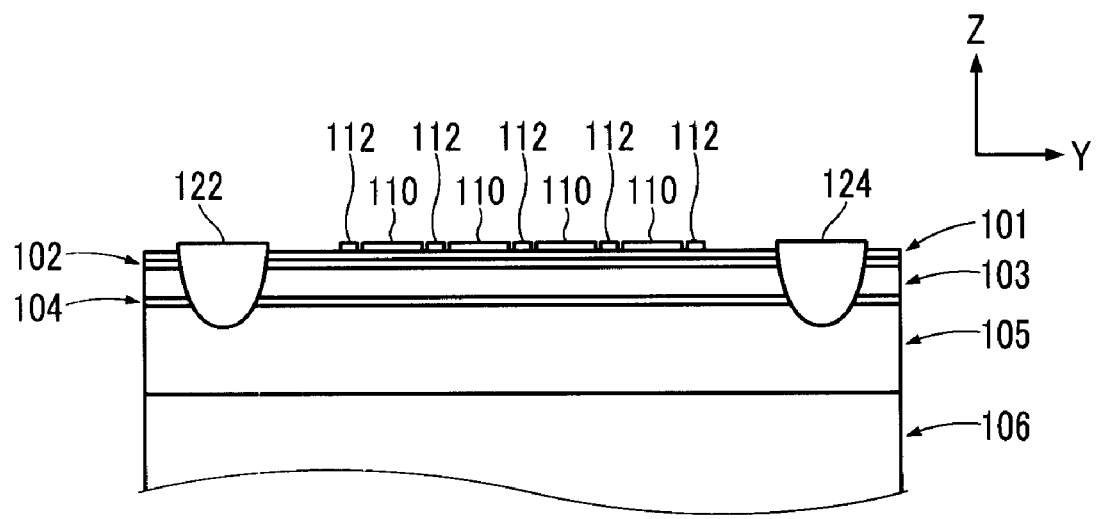
FIG. 2(a) is a cross-section diagram of line IIa-IIa of FIG. 1.
FIG. 2(b) is a cross-section diagram of line IIb-IIb of FIG. 1.
Figure 2:
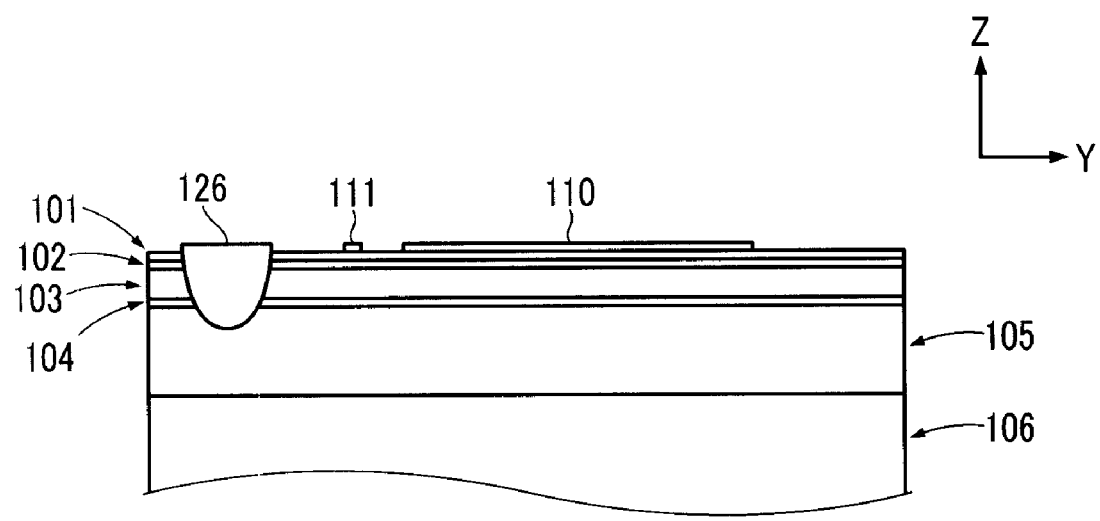

For example, the infrared light detector 100 is made of a multilayered heteroepitaxial growth semi-conductor substrate disclosed in Patent Document 1 and has a layered structure as illustrated in FIG. 2(a) and FIG. 2(b). The substrate is of a heterojunction structure including in order from the top an upper insulation layer (GaAs layer+Si—$Al_{0.3}Ga_{0.7}As$ layer) 101, a first electronic layer (GaAs layer) 102 as one two-dimensional electronic layer, an interlayer ($Al_xGa_{1-x}As$ layer) 103, a second electronic layer (GaAs layer) 104 as another two-dimensional electronic layer disposed parallel to the one two-dimensional electronic layer, a lower insulation layer ($Al_{0.3}Ga_{0.7}As$ layer+Si—$Al_{0.3}Ga_{0.7}As$ layer+$Al_{0.3}Ga_{0.7}As$ layer) 105 and an n-type GaAs substrate 106. The composition ratio x in the interlayer 103 is adjusted so as to form an energy diagram in the depth direction (−Z direction) of the substrate on an early phase of a disconnected status, as illustrated in FIG. 4(a).

As illustrated in FIG. 1, the first electronic layer 102 is formed to have a shape having four linear regions extending from a central portion of a belt-like region extending in the X direction. A plurality of first electronic regions (isolated two-dimensional electronic region) 10 which are electrically disconnected, are arranged in the X direction and formed in the first electronic layer 102 as conceptually indicated in FIG. 5(a). In each of the plurality of first electronic regions 10, a quantum well is formed in the −Z direction in an early phase of the disconnected status, as shown in FIG. 4(a), and there is formed a ground sub-band (energy level of $\epsilon_0$) and an excited sub-band (energy level of $\epsilon_1$ ($>\epsilon_0$)).

The second electronic layer 104 is formed approximately the same shape as the first electronic layer 102 and is disposed in the same posture as the first electronic layer 102 underneath the first electronic layer 102. That is, the second electronic layer 104 is formed in a shape such as the first electronic layer 102 being directly projected downward (−Z direction). In the second electronic layer 104, there is formed a conduction channel 120 which extends in the X direction and opposes the plurality of first electronic regions 10 in the Z direction, as conceptually shown in FIG. 5(a). The conduction channel 120 (more precisely, each of a second electronic regions 20 opposing each of the first electronic regions 10) has an energy level lower than that of the excited sub-band in the quantum well formed in the first electronic region 10 in the −Z direction in the early phase of the disconnected status, as illustrated in FIG. 4(a). Also, in this case, the Fermi level (electrochemical potential) of each of the second electronic regions 20 is equal to the Fermi level (electrochemical potential) of each of the corresponding first electronic regions 10.

The first electronic layer 102 and the second electronic layer 104 are connected by a first ohmic contact (drain electrode) 122 at the end region of one side in the X direction and by a second ohmic contact (source electrode) 124 at the end region of the other side in the X direction. A current or an electric conductivity of the conduction channel 120 in the X direction (a specific direction) is measured by an ammeter 128 connected to the first ohmic contact 122 and the second ohmic contact 124. Furthermore, the first electronic layer 102 and the second electronic layer 104 are connected by a third ohmic contact 126 at the tip end of each of the plurality of linear regions. Accordingly, each of the first electronic regions 10 arranged in the X direction (the specific direction) can be electrically connected to the second electronic regions 20 opposed to the first electronic regions 10 in the conduction channel 120 through the third ohmic contact 126.

The light coupling mechanism 110 is configured by a metal thin film provided on the upper side of the upper insulation layer 101 as shown in FIG. 2(a) and FIG. 2(b). The thickness of the metal thin film is approximately 0.1 μm.

As shown in FIG. 3(a), a plurality of windows which are apart from each other are formed on the metal thin film. The plurality of windows are periodically arranged in a posture having translation symmetry for at least each of the X direction and the Y direction. An array cycle p of the plurality of windows are set to fall within a range of 0.70 to 0.90 (λ/n) based on a wavelength λ of the incident infrared light and a refractive index n of the substrate (the upper insulation layer 101 or the like) including the first electronic layer 102. For example, the array cycle p of the window is set to be approximately 3.5 μm based on the wavelength of the infrared ray λ/n≈4.1 μm in a substrate (refractive index n≈3.57). Here, the array cycle p of the window may be the same or different for each of the X direction and the Y direction.

Each of the windows are formed in a multangular shape in which a part of the internal angles are obtuse angles. For example, as shown in FIG. 3(b), the window (the black portion) is formed in a shape such as two straight line segments having an angle (preferably a right angle) at the four corners crossing each other orthogonally in the middle, that is, a cross-like shape. With respect an array direction of the plurality of windows, a size I of each window is set to be within a range of 0.60 to 0.80 p. For example, a length I of each of a line segment extending in the X direction and a line segment extending in the Y direction is set to be approximately 2.3 μm. A width w of the line segments is set to be approximately 0.5 μm.

Here, besides a cross-like shape as shown in FIG. 3(b), the window may be formed to have various multangular shapes in which a part of the internal angles are obtuse angles as shown in each of FIG. 10(a) to FIG. 10(h).

The light coupling mechanism 110 concentrates infrared light photons on the first electronic region 10 and generates an oscillating electric field component perpendicular to the first electronic layer 102. By this, the electrons in the first electronic region 10 are excited to transition from the ground sub-band to the excited sub-band. It should be noted that various mechanisms for generating an electric field component perpendicular to the first electronic layer 102 from an incident infrared light can be applied as the light coupling mechanism 110, such as a microstrip antenna (a patch antenna), a grating or an inclined plane with an inclination angle of 45° formed on a substrate (for example the upper insulation layer 101) or the like.

The first gate electrode 111 is formed on the upper side of the first electronic layer 102 (the upper surface of the upper insulation layer 101), such as to traverse each of a plurality of linear regions extending from a belt-like region of the first electronic layer 102. Here, an independent first gate electrode 111 may be provided for each of the plurality of linear regions, and, in addition, the disconnected status and the connected status may be switched separately for each of the plurality of first electronic regions 10.

The first voltage controller 113 applies while adjusting at the same time a bias voltage to the first gate electrode 111. According to the bias voltage applied to the first gate electrode 111, a potential barrier is formed underneath the first gate electrode 111 which electrically disconnects the belt-like region of the first electronic layer 102 and the third ohmic contact 126.

The first gate electrode 111 and the first voltage controller 113 serve as "a status controlling mechanism" which performs switching between a disconnected status and a connected status of the first electronic region 10. "The disconnected status" means a status in which the first electronic region 10 is electrically disconnected from the outer electron system and the electron is limited or prohibited from flowing into the first electronic region 10 from the outer electron system. "The connected status" means a status in which the first electronic region 10 is electrically connected to the outer electron system and the electron is permitted, and not limited or prohibited, to flow into the first electronic region 10 from the outer electron system.

For each of the first electronic region 10, each of the second electronic regions 20 opposed to each of the first electronic regions 10 in the conduction channel 120 is configured as the outer electron system. The outer electron system is configured to satisfy a predetermined condition. "The predetermined condition" is a condition that the electron energy level $\epsilon_1$ of the excited sub-bands of each of the first electronic regions 10 in the connected status becomes higher with respect to the Fermi level (electrochemical potential) in each of the second electronic regions 20 in the conduction channel 120 to a degree which enables the electrons transitioned to the excited sub-bands of each of the first electronic regions 10 in the disconnected status to (easily or with high probability) flow out to each of the corresponding second electronic regions 20.

In view of the character that there is not so much change in the performance increase even if a size of the first electronic region 10 is selected arbitrarily, and in view of actual preparing conditions or the like, each of the first electronic regions 10 is configured such that the horizontal width thereof (a size in X direction) is within a range of 0.1 to 3.0λ and the longitudinal width thereof (a size in the Y direction) is within a range of 0.5 to 10λ (λ denotes a vacuum wavelength of the infrared light). For example, in a case where λ=14.7 μm, each of the first electronic regions 10 are configured such that the horizontal width thereof is 30 μm and the longitudinal width thereof is 130 μm.

Each of the plurality of second gate electrodes 112 are formed on the upper side of the first electronic layer 102 (an upper surface of the upper insulation layer 101), and traverses in the Y direction over the belt-like region extending in the X direction in the first electronic layer 102. It is also acceptable to form each of the second gate electrodes 112 to traverse the belt-like region in a direction inclined with respect the Y direction on the X-Y plane. The second voltage controller 114 applies while adjusting at the same time a bias voltage to each of the second gate electrodes 112. According to the bias voltage applied to the second gate electrode 112, a potential barrier is formed in a portion right below the second gate electrode 112 to electrically disconnect the first electronic layer 102 in the X direction.

Subsequently, the functions of the infrared light detector with the above-mentioned structure will be described.

By applying a bias voltage $V_{1G}$ to the first gate electrode 111, a potential barrier is formed in the lower region of the first gate electrode 111. Furthermore, by applying a bias voltage $V_{2G}$ to each of the second gate electrodes 112, a potential barrier is formed in the lower region of each of the second gate electrodes 112. A single first electronic region (the isolated two-dimensional electronic region) is formed by the potential barrier formed by a pair of second gate electrodes 112 at the both ends among the five second gate electrodes 112. The single first electronic region is divided into four mutually electrically independent first electronic regions 10 by the potential barrier formed by the three second gate electrodes 112 in the inner side (refer to FIG. 5(a)).

Figure 5:
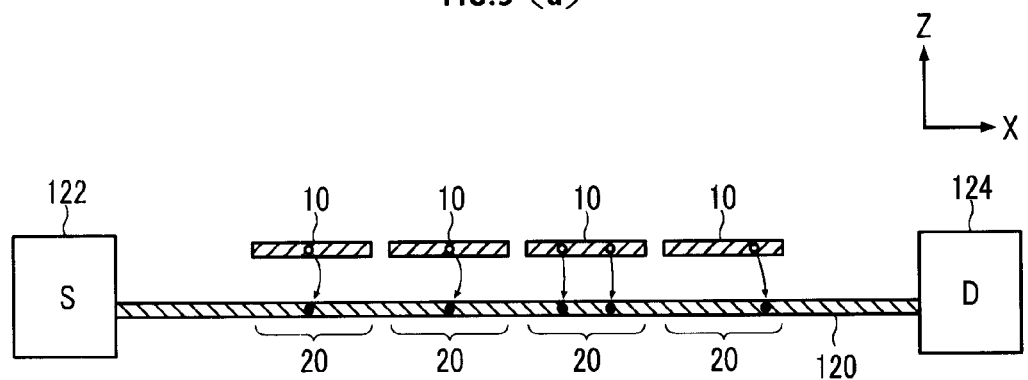
FIG. 5 is an explanatory diagram regarding a reset of the infrared light detector.
Figure 5:
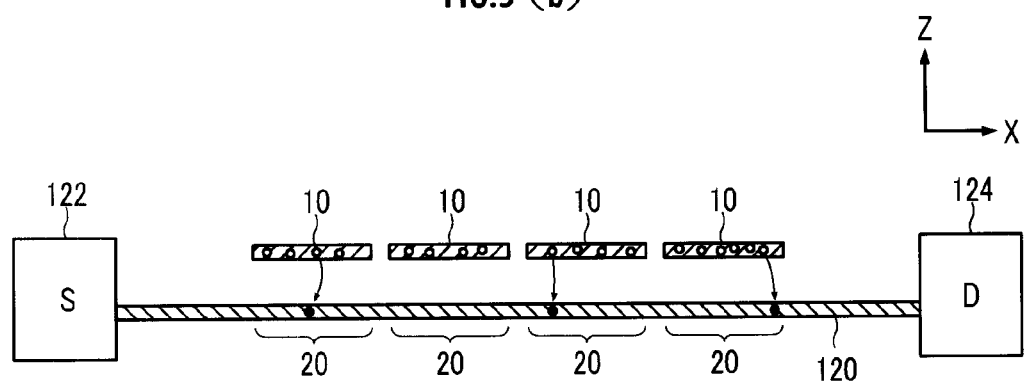
Figure 5:
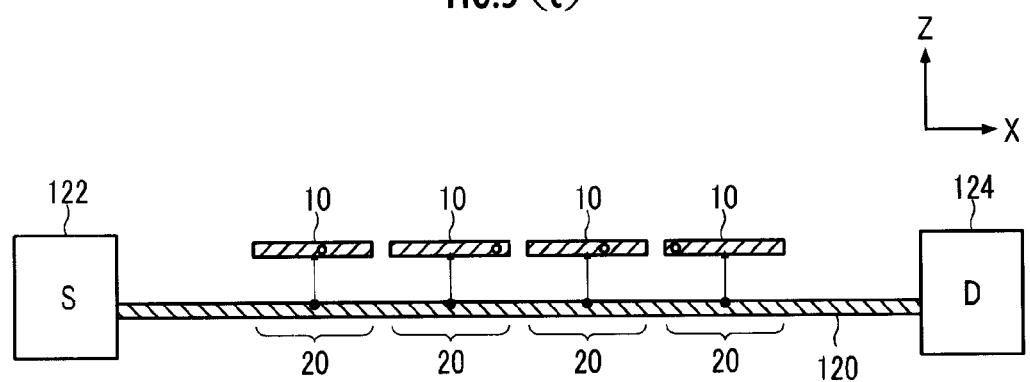

When the infrared light is incident on the infrared light detector 100, an oscillating electrical filed is formed in each of the plurality of first electronic regions 10 in the perpendicular direction (Z direction) by the light coupling mechanism 110. As a result, in each of the first electronic regions 10, the electrons are excited, and then escape from the quantum well and flows into the conduction channel 120 as described above (refer to FIG. 4(a)). Then, each of the first electronic regions 10 in the disconnected status and each of the second electronic regions 20 in the conduction channel 120 function as a capacitor sandwiching the interlayer 103 to accumulate positive electric charge in each of the first electronic regions 10. FIG. 5(a) schematically illustrates that electrons (represented by filled circles) flow out to the conduction channel 120 from the first electronic region 10 as illustrated by the arrows, and positive electric charges (represented by white circles) are accumulated in the first electronic region 10.

According to the increase of amount of positive electric charge ΔQ in the first electronic region 10, when it becomes to a state in which the energy high-low difference in the interlayer 103 disappears, the increase of the amount of electric charge in the first electronic region 10 stops and saturates (refer to FIG. 4(b)). FIG. 5(b) schematically illustrates a state in which a number of positive electric charges (represented by white circles) are accumulated in the first electronic region 10 and the amount of electric charge thereof has increased.

Here, the voltage applied to the first gate electrode 111 is lowered before the variation of the electric conductivity of the conduction channel 120 becomes saturated by the first voltage controller 113. Thus, the potential barrier existing between the first electronic region 10 and the third ohmic contact 126 is eliminated, and the first electronic region 10 is switched from the disconnected status to the connected status. Then, the electrons flow into the first electronic region 10 from the second electronic region 20 as the outer electron system. The electrons couple with the positive electric charges thereby resetting the amount of electric charge of the first electronic region 10 to zero instantly. FIG. 5(c) schematically illustrates that the second electronic region 20 is electrically connected with the first electronic region 10 through the third ohmic contact 126, and the electrons (represented by filled circles) flow into the first electron region 10 as shown by the arrows to couple with the positive electric charges (represented by white circles).

Thereafter, the first electronic regions 10 are switched from the connected status to the disconnected status, and then the variation of the electric conductivity of the conduction channel 120 is repeatedly detected as described above. Thus, by detecting the variation of the electric conductivity of the conduction channel 120 based on the measured value of the ammeter 128, it is able to detect the value of integral of the incident infrared light with high sensitivity.

The present invention is characterized in that it is able to switch between the disconnected status and the connected status of each of the first electronic regions 10 by having each of the second electronic regions 20, which are the opposed regions of each of the first electronic regions 10 in the conduction channel 120, as the outer electron system. Therefore, each time it is switched from the disconnected status to the connected status, the Fermi level (electrochemical potential) $\epsilon_F$ (=level $\epsilon_0$ of the ground sub-band) of each of the first electronic regions 10 and the Fermi level (electrochemical potential) $\epsilon_F$ of the second electronic region 20 become equal. As a result, regarding each of the first electronic regions 10 and each of the second electronic regions 20, the energy diagram returns to a status shown in FIG. 4(a) from a status shown in FIG. 4(b). That is, the energy levels of the excited sub-bands of each of the first electronic regions 10 returns to a sufficiently high status which enables the electrons transitioned to the excited sub-bands to flow out to the second electronic layer 104 from the first electronic region 10, easily or with high probability.

Figure 6:
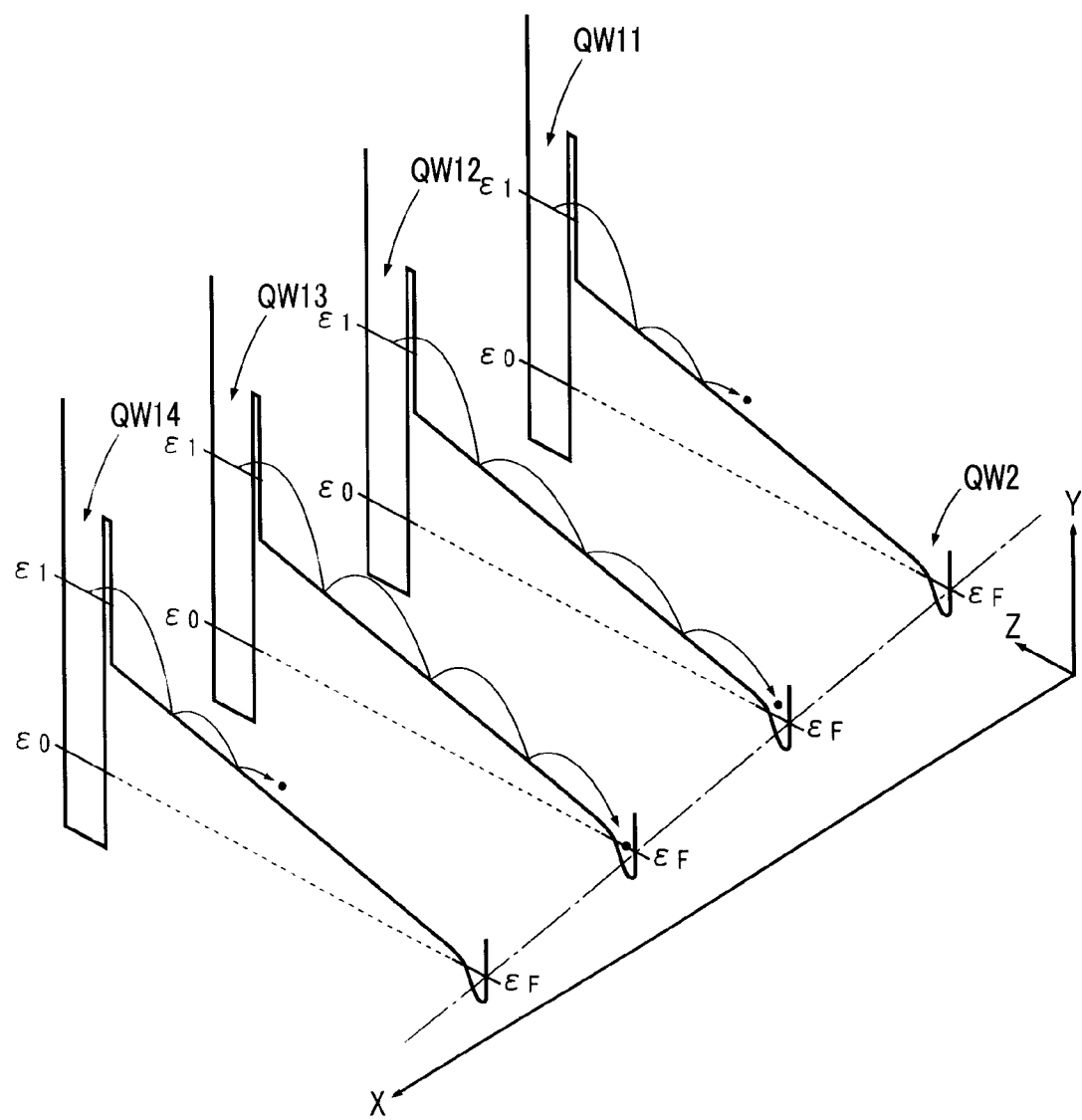
FIG. 6 is a total energy diagram of the infrared light detector of the present invention.
Figure 7:
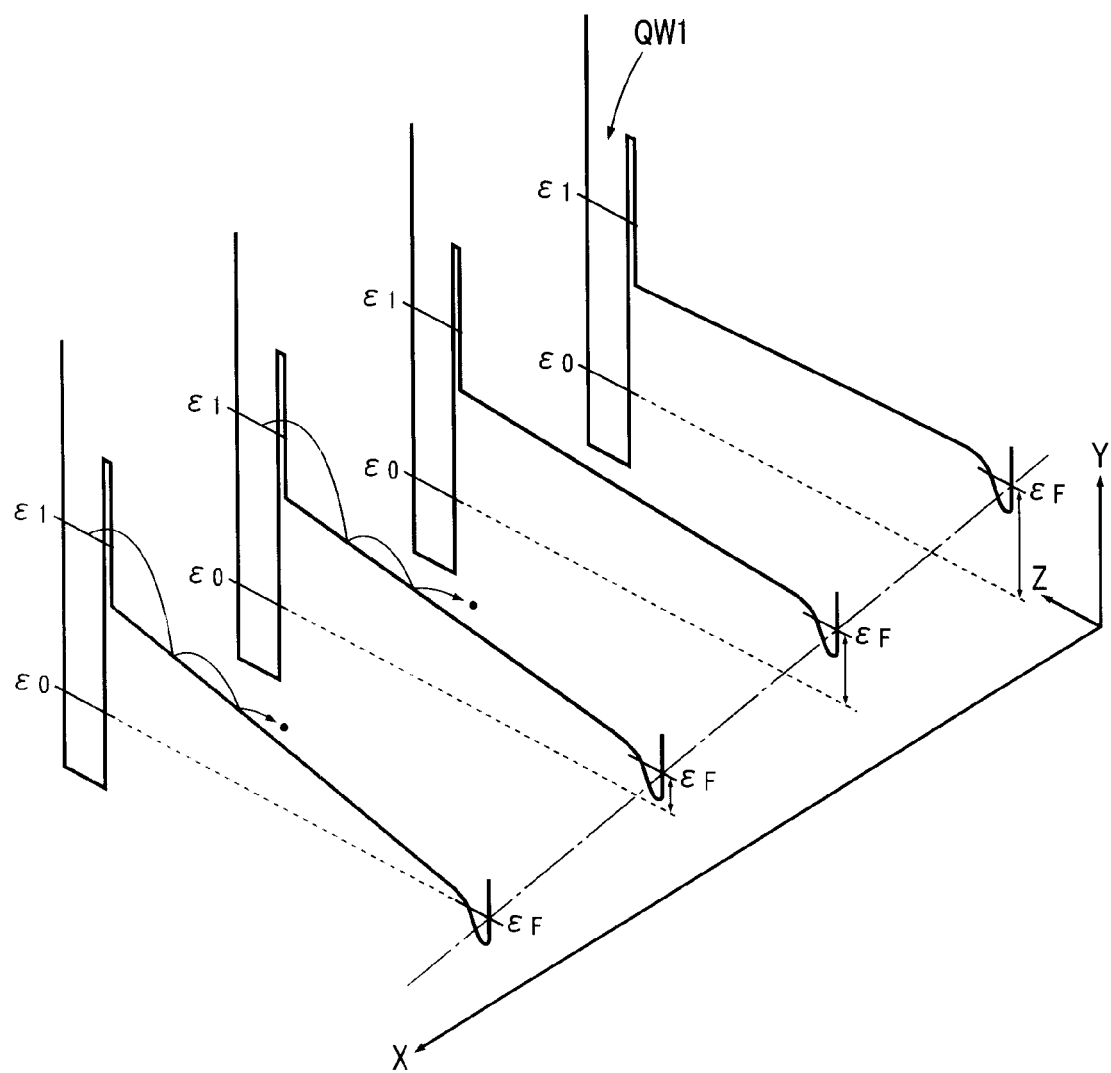
FIG. 7 is a total energy diagram of a conventional infrared light detector.

For example, the Fermi level (electrochemical potential) $\epsilon_F$ (=level $\epsilon_0$ of ground sub-bands of each of the quantum wells QW11 to QW14) of each of the four electrically independent first electronic regions 10 and the Fermi level (electrochemical potential) $\epsilon_F$ of each of the second electronic regions 20 become equal, each time it is switched from the disconnected status to the connected status as shown in FIG. 6. It should be noted that the electron energy level of each of the first electronic regions 10 can be controlled independently, whereas the electron energy level of each of the second electronic regions 20 are controlled uniformly according to a potential gradient in the conduction channel 120.

Accordingly, even if there is a potential gradient (refer to the dashed line) in the X direction (the specific direction) in the conduction channel 120, the high-low difference between the level $\epsilon_1$ of the excited sub-bands of each of the first electronic regions 10 and the Fermi level (electrochemical potential) $\epsilon_F$ of each of the second electronic regions 20 is ensured to a degree which enables the electrons transitioned to the excited sub-bands to escape from the first electronic region 10 in the disconnected status easily or with high probability (refer to the arrow of FIG. 6). Therefore, it is able to escape the electrons from each of the first electronic regions 10 to the conduction channel 120, especially to the second electronic regions 20 easily, while enlarging the potential difference (=source-drain voltage) of the conduction channel 120 for the specific direction (for example, 40 to 50 mV in a case where there are four first electronic regions 10).

In other words, since a single first electronic region (=isolated two-dimensional electronic region) is divided into n number of first electronic regions 10 (n=4 in the present embodiment), the increase of Fermi level (electrochemical potential) CF for each first electronic region 10 is limited to approximately 1/n as shown in FIG. 6. Therefore, the saturated amount of electric charge of each of the first electronic regions 10 becomes $\Delta Q_{sat}=(U_1-\epsilon_0-eV_{SD}/n)C/e$, and from the condition $eV_{SD}/n \ll U_1-\epsilon_0 < h\nu$, source-drain voltage $V_{SD\ of\ approximately}$ 0.22* nhν/e, that is, a voltage approximately n times higher compared to that of the single first electronic region before the division, can be applied to the conduction channel 120, and also the signal current and sensitivity increase in proportion thereto.

Figure 8:
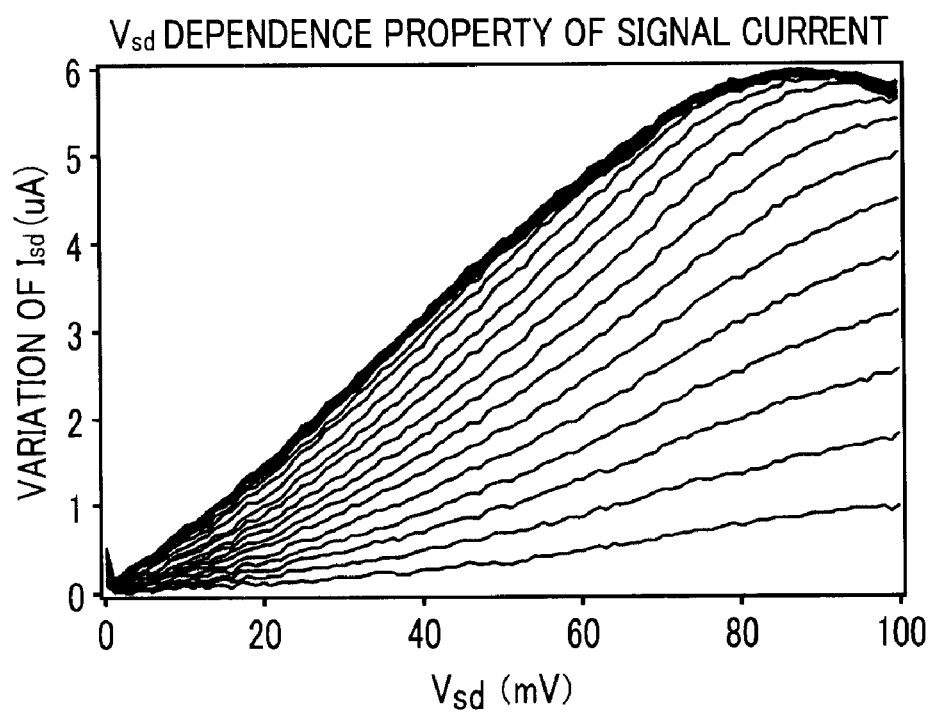
FIG. 8 is an explanatory diagram regarding an infrared light detection sensitivity of the infrared light detector of the present invention.
Figure 8:
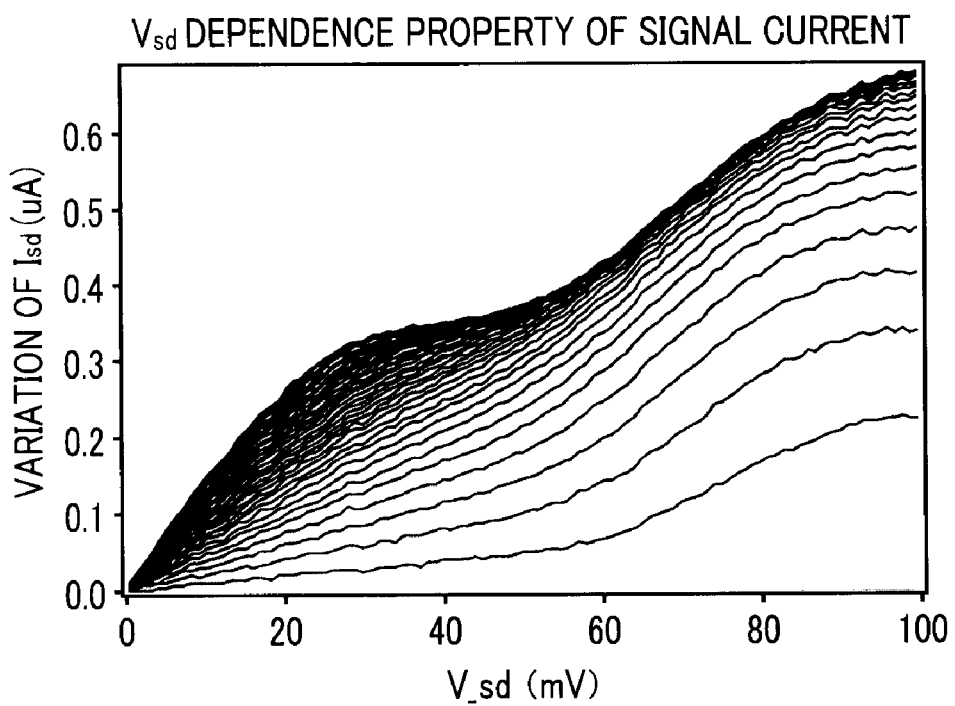

FIG. 8 shows an experimental result regarding the infrared light detecting sensitivity of each of the infrared light detector 100 (refer to FIG. 1) as one embodiment of the present invention in which the single region is divided into n number of first electronic regions 10 (n=4), and a conventional infrared light detector in which the single region is adopted as the single first electronic region.

FIG. 8(a) shows measurement results of dependence property of a source-drain current $I_{sd}$ with respect to a source-drain voltage $V_{sd}$ in the infrared light detector 100 (embodiment). FIG. 8(b) shows measurement results of dependence property of the source-drain current $I_{sd}$ with respect to the source-drain voltage $V_{sd}$ in the infrared light detector (comparative example). Each of the plurality of curved lines indicated in FIG. 8(a) and FIG. 8(b) expresses measurement results at each of a plurality of different time points during the elapsed time 0.25 ms to 10 ms from the reset (refer to FIG. 5(c)) by every 0.25 ms in order from the lowest.

As clear from FIG. 8(b), according to the infrared light detector (comparative example), the current signal $I_{sd}$ saturates at approximately $V_{sd}$=20 mV under all conditions. Therefore, it is only able to apply source-drain voltage $V_{sd}$ up to approximately 20 mV. Here, the increase of current signal $I_{sd}$ in the region equal to or above $V_{sd}$=50 mV is due to a mechanism different from an optical response signal. A similar measurement result is obtained in a case where the size of the single first electronic region 10 is enlarged.

On the other hand, as clear from FIG. 8(a), according to the infrared light detector 100 (embodiment), the current signal $I_{sd}$ linearly increases to approximately $V_{sd}$=80 mV under all conditions. Therefore, it is able to apply a source-drain voltage $V_{sd}$ of approximately 80 mV. That is, according to the infrared light detector 100 (embodiment), the infrared light detection sensitivity is increased approximately n times (n=4) compared to the conventional infrared light detector (comparative example).

Figure 9:
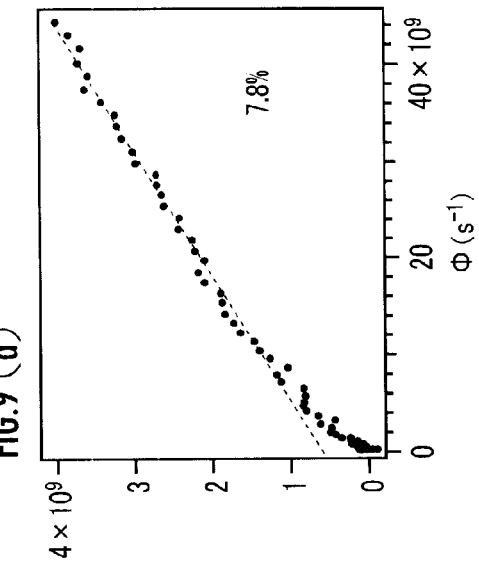
FIG. 9 is an explanatory diagram regarding quantum efficiency of the infrared light detector of the present invention.
Figure 9:
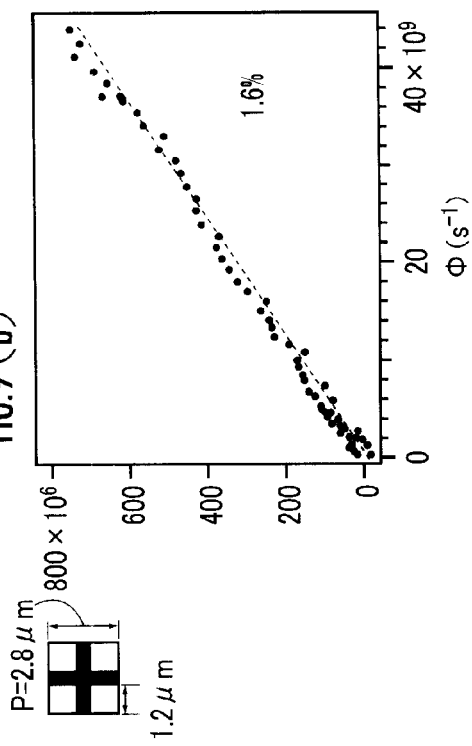
Figure 9:
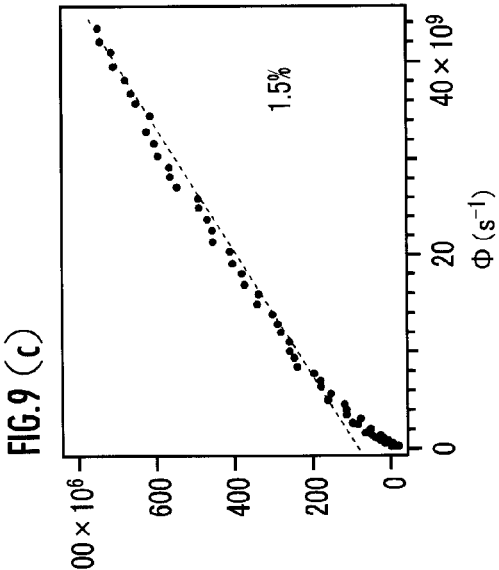
Figure 9:
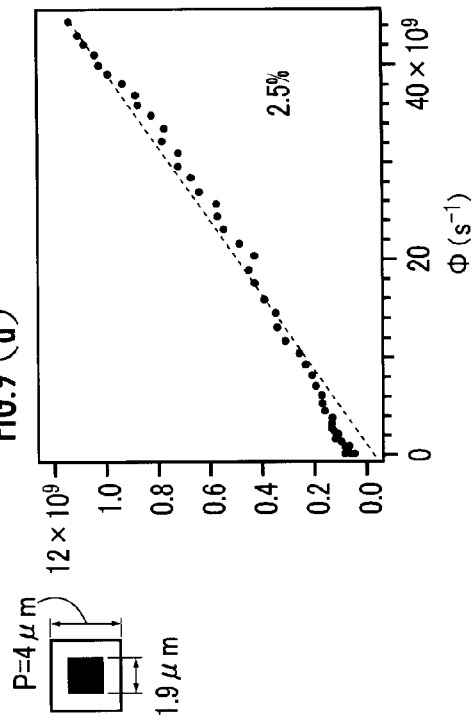
Figure 10:
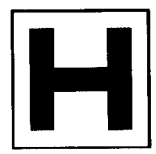
FIG. 10 is a structural explanatory diagram illustrating a light coupling mechanism of an infrared light detector according to another embodiment of the present invention.
Figure 10:
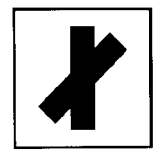
Figure 10:
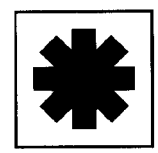
Figure 10:
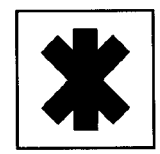
Figure 10:
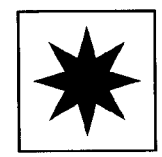
Figure 10:
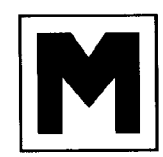
Figure 10:
Figure 10:
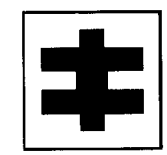

FIG. 9 shows a measurement result of quantum efficiency η of infrared light detection in a case where each of a plurality of types of light coupling mechanisms 110 having different window shapes or the like, are adopted. The measurement results are plotted on a plane in which the horizontal axis expresses a photon incidence rate $\Phi s^{-1}$ to the first electronic region 10, and the vertical axis expresses an electron outflow rate $\Xi s^{-1}$ to the conduction channel 120. The quantum efficiency η is defined as a ratio $\Xi/\Phi$, which is a ratio of electron outflow rate $\Xi s^{-1}$ to the conduction channel 120 with respect to the photon incidence rate $\Phi s^{-1}$ to the first electronic region 10. That is, the inclination of the approximated curve of the plot expressing the measurement result indicates the quantum efficiency η.

(Embodiment 1)

FIG. 9(a) expresses the experiment results in a case where the light coupling mechanism 110 shown in FIG. 3 (a) and FIG. 3(b) is formed. In this case, the quantum efficiency η was 7.8%.

(Comparative Example 1)

FIG. 9(b) expresses the experiment results in a case where the light coupling mechanism 110 is formed by a metal thin film in which cross shaped windows configured by line segments having a length of l=2.8 μm and a width of w=0.5 μm which cross each other orthogonally at center portions, are arranged sequential to each other by a cycle of p=2.8 μm in each of the X direction and the Y direction. In this case, the quantum efficiency η was 1.6%.

(Comparative Example 2)

FIG. 9(c) expresses the experiment results in a case where the light coupling mechanism 110 is formed by a metal thin film in which squared shaped windows with each sides having a length of w=3.3 μm, are arranged apart from each other by a cycle of p=4.0 μm in each of the X direction and the Y direction. In this case, the quantum efficiency η was 1.5%.

(Comparative Example 3)

FIG. 9(d) expresses the experiment results in a case where the light coupling mechanism 110 is formed by a metal thin film in which squared shaped windows with each sides having a length of w=1.9 μm, are arranged apart from each other by a cycle of p=4.0 μm in each of the X direction and the Y direction. In this case, the quantum efficiency η was 2.5%.

From the above experiment results, it is found that the light coupling mechanism 110 of embodiment 1 significantly improves the quantum efficiency compared to comparative examples 1 to 3.

Although, in the above embodiment, each of the second electronic regions 20 in the conduction channel 120 was adopted as the outer electron system of each of the first electronic regions 10, it is acceptable to adopt all kinds of outer electron systems which satisfy the predetermined condition as alternative embodiments. For example, with respect to each of the first electronic regions 10, a region having higher potential than each of the second electronic regions 20 in the conduction channel 120, or the first ohmic contact 122 may be used as the outer electron system. Moreover, with respect to each of the first electronic regions 10, a region having lower potential than each of the second electronic regions 20 in the conduction channel 120 may be used as the outer electron system.

Although, outer electron system having different Fermi level was used for each of the first electronic regions 10 in the present embodiment, it is acceptable to use an outer electron system having a common Fermi level for 2 or more first electronic regions 10 as an alternative embodiment. For example, it is acceptable to use one second electronic region 20 on the highest potential side in the conduction channel 120 as the outer electron system for each of the first electronic regions 10.

What is claimed is:

1. An infrared light detector, comprising:
    a first electronic region configured to be capable of being maintained in an electrically isolated status in a first electronic layer which is a two-dimensional electronic layer;
    a light coupling mechanism configured to excite an electron by generating an oscillating electric field component perpendicular to the first electronic region according to an incident infrared light, and allowing the electron to transit between sub-bands in a quantum well formed in the first electronic region;
    a conduction channel in a second electronic layer which is a two-dimensional electronic layer disposed parallel to the first electronic layer via an intermediate insulation layer, whose electric conductivity varies as a result of the electron excited by the light coupling mechanism flowing out of the first electronic region;
    a status controlling mechanism configured to perform switching between a disconnected status in which the first electronic region is electrically disconnected from an outer electron system and a connected status in which the first electronic region is electrically connected to the outer electron system; and
    which detects the incident infrared light by detecting a variation of the electric conductivity with respect to a specific direction of the conduction channel,
    wherein the first electronic region which is a single first electronic region, is divided into a plurality of first electronic regions which are electrically independent from each other and are arranged in the specific direction opposed to the conduction channel,
    wherein the outer electron system is configured to satisfy a predetermined condition for each of the plurality of first electronic regions, and
    wherein the predetermined condition is a condition that an electron energy level of the excited sub-bands of each of the plurality of first electronic regions in the connected status becomes higher with respect to a Fermi level of each of second electronic regions opposed to each of the plurality of first electronic regions in the conduction channel to a degree which enables the electron transitioned to the excited sub-bands of each of the plurality of first electronic regions in the disconnected status to flow out to each of the second electronic regions.

2. The infrared light detector according to claim 1, wherein each of the second electronic regions are configured as the outer electron system of each of the plurality of first electronic regions.

3. The infrared light detector according to claim 1, wherein a plurality of gate electrodes are formed so as to traverse the single first electronic region on an upper surface of an upper insulation layer which sandwiches the first electronic layer which is a two-dimensional electronic layer together with the intermediate insulation layer, and
    wherein the single first electronic region is divided into the plurality of first electronic regions, by applying bias voltage to each of the gate electrodes to form a potential barrier in the first electronic layer which is a two-dimensional electronic layer.

* * * * *